United States Patent [19]

Okamoto et al.

[11] Patent Number: 5,721,090
[45] Date of Patent: Feb. 24, 1998

[54] METHOD OF ETCHING A SUBSTRATE

[75] Inventors: Shin Okamoto, Kofu; Kouichiro Inazawa, Tokyo; Sachiko Furuya, Tokyo; Maki Koizumi, Tokyo, all of Japan

[73] Assignee: Tokyo Electron Limited, Tokyo, Japan

[21] Appl. No.: 530,910

[22] Filed: Sep. 20, 1995

[30] Foreign Application Priority Data

Sep. 22, 1994 [JP] Japan ................................ 6-254449
Oct. 31, 1994 [JP] Japan ................................ 6-290392

[51] Int. Cl.⁶ ................................................ G03F 7/00
[52] U.S. Cl. .......................... 430/313; 430/316; 430/323
[58] Field of Search ........................... 430/311, 313, 430/316, 317, 318, 323; 156/643.1

[56] References Cited

U.S. PATENT DOCUMENTS 5,240,554  8/1993  Hori ........................................ 156/643
5,437,961  8/1995  Yano ....................................... 430/316

OTHER PUBLICATIONS

Thompson, L.F. (ed.), "Introduction to Microlithography", ACS Symposium Series 219, pp. 223–258 1983.

Primary Examiner—Kathleen Duda
Attorney, Agent, or Firm—Oblon, Spivak, McClelland, Maier & Neustadt, P.C.

[57] ABSTRACT

An etching method comprising the steps of forming an etched layer on a wafer and covering the etched layer with an anti-reflection cover and then the anti-reflection cover with a photoresist film, pattern-exposing the photoresist film, developing the exposed photoresist film to form pattern openings in each of which the anti-reflection cover is exposed, and carrying the wafer into a chamber, exhausting the chamber to decompressed atmosphere, and introducing a mixed gas of $C_4F_8$ gas and at least one of $O_2$ and $N_2$ gases into the process chamber to generate plasma of this mixed gas and act active species in this plasma on the wafer, whereby the anti-reflection cover which is exposed in each of the pattern openings is etched and the etched layer is then etched without etching the photoresist film formed on an inner surface each pattern opening.

7 Claims, 7 Drawing Sheets

METHOD OF ETCHING A SUBSTRATE

BACKGROUND OF THE INVENTION

1. Field of the Invention

The present invention relates to a method of etching thin film on a semiconductor wafer and a substrate with higher accuracy.

2. Description of the Related Art

Super-micro process of sub-micron order is now asked in the making of semiconductor devices and the masking technique in photolithography has become more and more accurate. Particularly as semiconductor devices are more highly integrated and micro-processed, the interval between adjacent gates of the FET (field effect transistor) has become smaller and smaller, thereby asking the etching technique to be made more accurate. In the photolithography, a layer to be etched is etched to form pattern openings such as contact holes. Gate oxide film, polysilicon layer or silicon single crystal substrate consisting of SiN and $SiO_2$ can be cited as this layer to be etched.

Figure 1A:
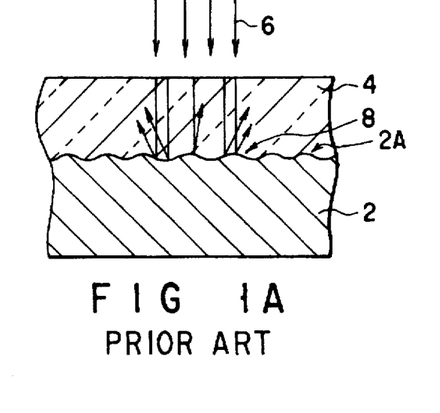
FIGS. 1A and 1B are sectional views intended to explain a conventional etching method (no anti-reflection cover is provided in this case)
Figure 1B:
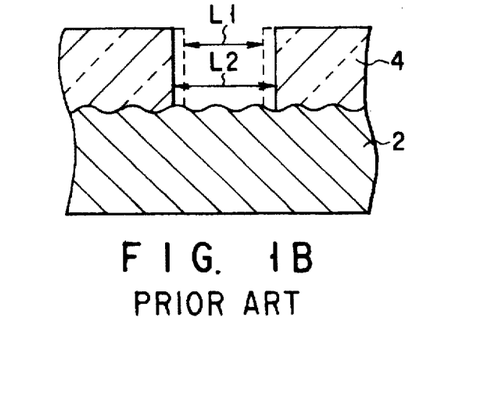

As shown in FIG. 1A, the surface 8 (which serves as a reflector for exposing light 6) of a etched layer 2 is uneven when viewed in micro-scale. The exposing light 6 is therefore irregularly reflected by the reflector 8 and the light-sensitive area of photoresist film 4 is thus enlarged. As the result, the line width $L_2$ of the pattern opening becomes larger than an intended line width $L_1$, as shown in FIG. 1B, thereby reducing the accuracy of a mask.

Figure 2A:
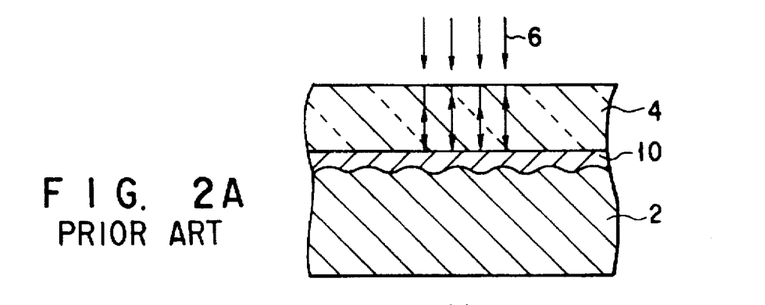
FIGS. 2A through 2C are sectional views intended to explain another conventional etching method (anti-reflection cover is provided in this case)
Figure 2B:
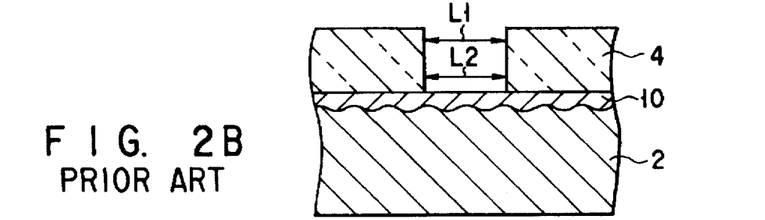

The irregular reflection of the exposing light 6 is therefore prevented by coating the etched layer 2 with an anti-reflection cover 10 (which will be hereinafter referred to as ARC), as shown in FIG. 2A. The ARC 10 is excellent in flatness and it makes the reflecting face 8 more ideally flat. The photoresist film 4 is coated on the ARC 10 and when it is exposed and developed, the line width $L_2$ becomes substantially same as the intended one $L_1$, thereby enabling a photoresist mask to be made with a higher accuracy.

Figure 2C:
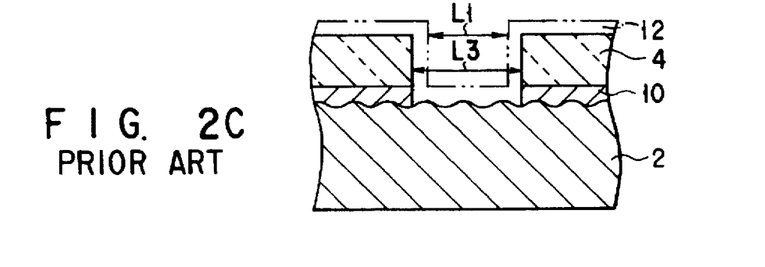

The etched layer 2 is coated with the ARC 10. It is therefore needed that the ARC 10 is removed by etching and that the etched layer 2 is exposed in the pattern opening. Conventionally, oxygen radicals in ozone were used to remove the ARC 10. However, oxygen radicals have isotropic etching characteristic. The photoresist film 4 is thus etched along with the ARC 10 by oxygen radicals. As the result, the line width $L_3$ of the pattern opening becomes larger than the intended one $L_1$, as shown in FIG. 2C.

Another problem the present invention intends to solve will be described referring to FIGS. 9A and 9B.

When a metal under-layer such as aluminum and tungsten is present under oxide film such as $SiO_2$, care must be taken to etch only the etched layer but the metal under-layer. It is therefore needed that etching gas having a higher selection rate relative to the etched layer than relative to the metal under-layer is used. To meet this high selection rate etching, mixed gas of CO and $C_4F_8$ added is used as the etching gas.

As circuits are more highly integrated, some demands are also asked about the shape of the pattern opening.

Figure 9A:
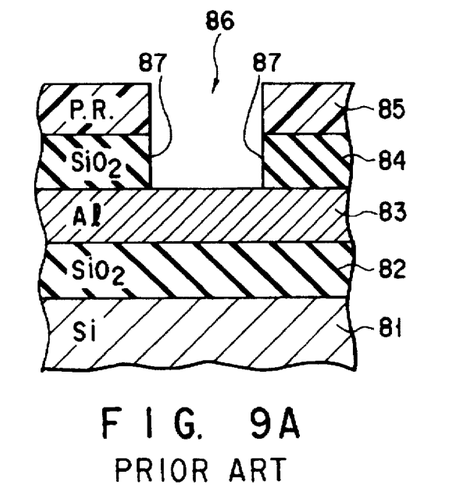
FIGS. 9A and 9B are sectional views showing a pattern opening conventionally etched and filled with metal.

FIG. 9A is a vertically-sectioned view showing a typical example of the pattern opening 86. A metal under-layer (or aluminum thin film) 83 is formed between two insulating layers (or $SiO_2$ films) 82 and 84. Photo-resist film 85 is coated on the second insulating layer 84 and it is exposed, developed and etched. The second insulating layer 84 is thus etched at a high selection rate. The pattern opening 86 is formed in the second insulating layer 84 by this high selection rate etching. It is enclosed by a substantially vertical side wall 87. When it is formed by anisotropic etching, the angle of its enclosing side wall 87 relative to its bottom becomes nearer 90° as the selection rate becomes higher. After the photoresist film 85 is removed, the pattern opening 86 is filled with metal such as aluminum to form a wiring layer 88.

Figure 9B:
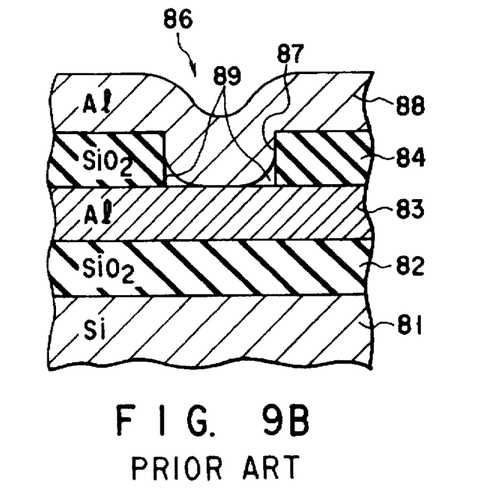

As shown in FIG. 9B, however, faults such as voids 89 are likely to be caused at bottom corners of the pattern opening 86, thereby causing wirings 83 and 88 to be disconnected. They are likely to be caused particularly when the wiring has the intended line width $L_1$ smaller than 0.2 μm. In the case of the super LSI circuit wiring, therefore, the rate of metal filled in the pattern opening must be made high.

SUMMARY OF THE INVENTION

An object of the present invention is to provide an etching method capable of etching an anti-reflection cover while preventing a photoresist film from being removed in the horizontal direction.

Another object of the present invention is to provide an etching method capable of forming such a pattern opening at a higher selection rate that has a shape more fully filled with metal.

An etching method according to the present invention comprises the steps of forming an etched layer (i.e., a layer to the etched) on a substrate, covering the etched layer with an anti-reflection cover, and covering the anti-reflection cover with a photoresist film; pattern-exposing the photoresist film; developing the exposed photoresist film to form pattern openings in each of which the anti-reflection cover is exposed; and carrying the substrate into a chamber, exhausting the chamber to decompressed atmosphere, and introducing mixed gas of $C_4F_8$ gas and at least one of $O_2$ and $N_2$ gases into the chamber to generate plasma of this mixed gas and act active species in the plasma on the substrate, whereby the anti-reflection cover which is exposed in each of the pattern openings is etched and the etched layer is also etched without etching the photoresist film formed on an inner surface of each of the pattern openings.

A component solution which can be easily coated of the surface of the wafer by the spin coater is used to form the anti-reflection cover. This component solution includes a carbon component and a volatile constituent. Particles of the carbon system matter such as carbon black are suitable for the carbon component. A matter same as or similar to volatile constituent such as cyclohexanone and acetone contained in photoresist solution is used as the volatile constituent. This ARC film is extremely excellent in its flatness after it is dried. In addition, it is easily anisotropy-etched. It is preferable that its film thickness is in a range of 40–100 nm after it is dried.

Mixed gas of $C_4F_8$ gas and at least one of $O_2$ and $N_2$ gases is used as etching gas. This enables only the anti-reflection cover to be etched while almost preventing the photoresist film from being etched in the horizontal direction (or direction perpendicular to the film thickness). A mask having a higher accuracy in dimension can be thus provided and it enables a circuit, which has a super-micro line width of sub-micron order, to be formed. Particularly when the amount of $O_2$ and $N_2$ gases is set to be from 3 to 5 times, more preferably 4 times the amount of $C_4F_8$ gas, the photoresist film can be fully prevented from being removed in the horizontal direction (or direction perpendicular to the film thickness).

When the mixed gas of $C_4F_8$ and CO gases is used as etching gas, a higher selection rate can be attained but the pattern opening comes to have an enclosing side wall substantially vertical to its bottom (its tapered angle θ is about 90°). This shape of the pattern opening makes it easy to provide voids 89 at the bottom corner of the hole.

Further, active fluorine radicals caused when $C_4F_8$ is dissociated by plasma are deactivated by CO. Kinds of gas reactive with the insulating film ($SiO_2$, for example) are thus reduced to thereby make lower the etching rate relative to the insulating film. When only $C_4F_8$ gas is used to prevent the etching rate from becoming lower, a lot of deposition of the fluorocarbon group is present on the insulating film to thereby prevent the etching rate from being made higher. When a lot of this deposition of the fluorocarbon group is present, etching reaction does not advance, leading to a narrower range in the operable internal pressure of the chamber.

Another etching method according to the present invention comprises the steps of forming a metal under-layer on a substrate and then an insulating layer on the metal under-layer and coating the insulating layer with a photoresist film; pattern-exposing the photoresist film; developing the exposed photoresist film to form pattern openings in each of which the insulating layer is exposed; carrying the substrate into a chamber, exhausting the chamber to decompressed atmosphere, and introducing a gas of the fluorocarbon group together with one, two or more selected from a group of $O_2$, $N_2$, $CO_2$, $N_2O$, $NF_3$, $SF_6$, $SO_2$, He, Ar, Kr and Xe gases into the chamber, while controlling the amount of the selected gases added to the gas of the fluorocarbon group, to generate plasma and act active species in the plasma on the insulating layer to etch it so as to form pattern openings each of which has an enclosing side wall obtuse to its bottom; and filling each pattern openings with metal to form a metal wiring layer connected to the metal under-layer.

$SiO_2$, SiN, single crystal silicon and polycrystal silicon films can be cited as the insulating layer.

$CHF_3$, $CF_4$, $C_2F_6$ and $C_3F_8$ gases in addition to $C_4F_8$ gas may be used as the fluorocarbon group gas.

Further, the temperature of the substrate-mounted table may be adjusted to change etching action between the substrate and active species and control the shape of each pattern opening.

According to findings of inventors, it has been found that the selection rate of etching becomes by far lower when the amount of gas added is made too smaller than that of fluorocarbon group gas. It is therefore desirable that the amount of one, two or more selected from a group of $O_2$, $N_2$, $CO_2$, $N_2O$, $NF_3$, $SF_6$, $SO_2$, He, Ar, Kr and Xe gases and added is set to be smaller than 50 volume %.

When $C_4F_8$ gas is dissociated by plasma, $CF_2^+$ ions are created. These $CF_2^+$ ions serve to make it difficult to create free fluorine radicals by which the metal under-layer is etched. Therefore, a higher selection rate of etching only the insulating layer 84 but the metal under-layer 83 can be realized.

When $C_4F_8$ gas is dissociated by plasma and the oxide film $SiO_2$ on the top of the silicon wafer is etched, the film (or $CF_2$, for example) of the fluorocarbon group is deposited on the bottom of each pattern opening to thereby tilt the enclosing side wall of the hole (or the tapered angle θ of the side wall relative to the bottom becomes obtuse). The fluorocarbon group film tends to be removed by $O_2$ which is caused at the time of $SiO_2$ etching. However, only $O_2$ contained in $SiO_2$ is not enough to realize a desired angle θ. When the fluorocarbon group film is removed by $O_2$ or others added to $C_4F_8$ gas, therefore, the slope of the enclosing side wall of each pattern opening can be controlled. It is preferable that the tapered angle θ of each pattern opening is in a range of 100°–110°.

Further, the speed at which the fluorocarbon group film is deposited becomes low when wafer temperature is made high. The tapered angle θ of each pattern opening becomes small (or substantially vertical) accordingly. On the other hand, it becomes high when wafer temperature is made low. Therefore, the tapered angle θ becomes large (or obtuse). It may be therefore arranged that the temperature of the wafer-mounted table (or suscepter) is lowered to cool the wafer, form a pattern opening having a large tapered angle θ and make the filling of metal into each pattern opening high.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Some preferred embodiments of the present invention will be described with reference to the accompanying drawings.

Figure 3:
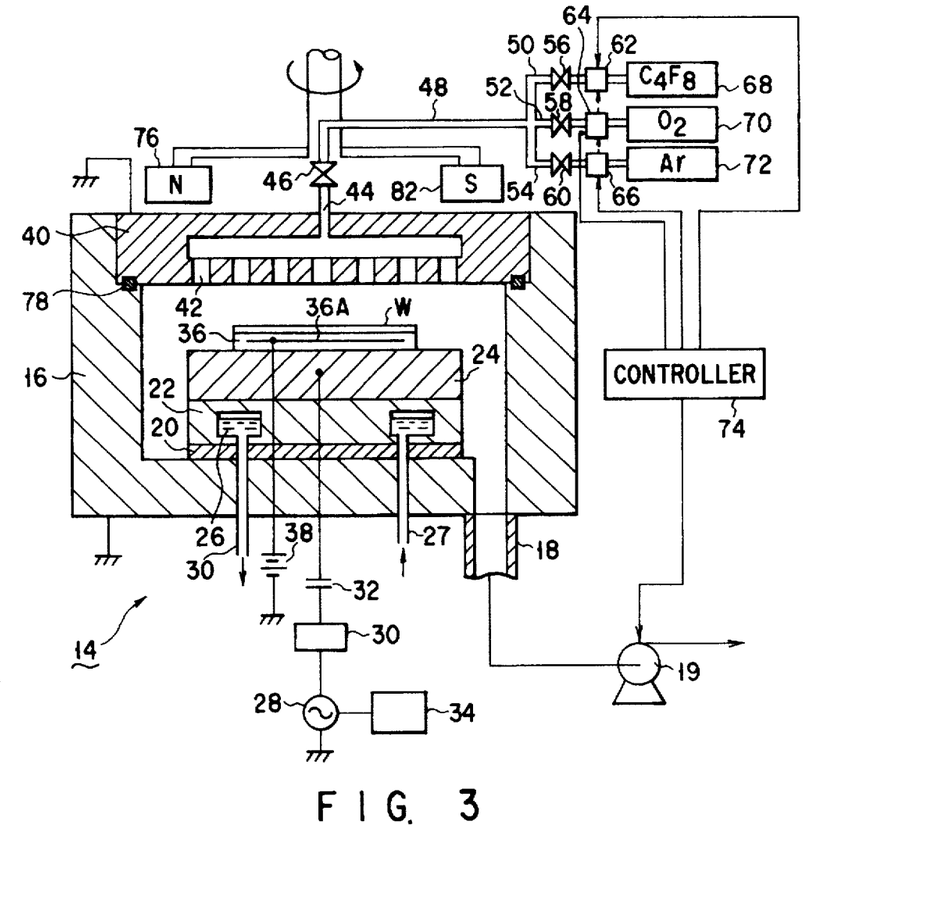
FIG. 3 is a sectional block diagram showing a plasma etching apparatus employed by the etching method according to a first embodiment of the present invention.

An etching apparatus 14 is of the hyperbolic magnetron plasma type for etching thin film formed on a semiconductor wafer. Its process chamber 16 is earthed. An exhaust pipe 18 extends from the bottom of the process chamber 16 and it is communicated with a vacuum pump 19 to exhaust the process chamber 16 to a high vacuum. The process chamber 16 has a volume of about 35 liters.

A suscepter support 22 made of aluminum is arranged on the bottom of the process chamber 16 in the center thereof through an insulating plate 20 and a suscepter 24 made of aluminum is arranged on the suscepter support 22. A cooling chamber 26 is formed in the suscepter support 22. Inlet and outlet pipes 27 and 30 are communicated with the cooling chamber 26 to circulate coolant between a coolant supply source (not shown) and the cooling chamber 26 through them. This cooling system enables the suscepter 24 to be adjusted in a temperature range of −200° C.−+200° C.

A radio frequency power source 28 of 13.56 MHz for generating plasma is connected to the suscepter 24 via a matching circuit 30 and a blocking capacitor 32 with the power source thus applying a high frequency voltage across the electrodes 24(suscepter) and 40(shower). This radio frequency power source 28 is controlled to adjust it's output by an output controller 34. An electrostatic chuck 36 is arranged on the top of the suscepter 24 to electrostatically attract and hold a wafer W thereon.

An earthed shower electrode 40 is arranged as a top of the process chamber 16. As will be readily recognized by those skilled in the art, the shower electrode 40 is parallel to the suscepter electrode 24, and the FIG. 3 arrangement produces a down flow of plasma acting on the substrate. It is made of amorphous carbon or SiC. It is made hollow and it has a plurality of apertures in its bottom. Its hollow portion is communicated with a gas inlet 44, which is communicated with a pipe 48. A main valve 46 is attached to the gas inlet 44.

The pipe 48 is divided into three branching pipes 50, 52 and 54 at the base end thereof. These branching pipes 50, 52 and 54 are communicated with gas supply sources 68, 70 and 72, respectively. Valves 56, 58, 60 and mass flow controllers 62, 64, 66 are attached to the branching pipes 50, 52 and 54.

$C_4F_8$ gas is stored, as main etching gas, in the first gas supply source 68, $O_2$ gas in the second gas supply source 70 as adding gas, and Ar gas in the third gas supply source 70 as carrier gas. Instead of $O_2$ gas, $N_2$ gas may be used as adding gas. Instead of Ar gas, He, Kr or Xe gas may be used as carrier gas.

A controller 74 is incorporated into a computer system for controlling and watching each operation of the etching apparatus 14. Etching conditions per a wafer are inputted into an input section of the computer system. An output section of the controller 74 is connected to mass flow controllers 62, 64, 66, valves 46, 56, 58, 60 and the vacuum pump 19 to send command signal to them responsive to data inputted.

Gas flow rates of gases supplied from the first, second and third gas supply sources 68, 70 and 72 are controlled. The controller 74 is incorporated into the computer system for controlling and managing each operation of the etching apparatus 14, and various etching conditions per a wafer are inputted into the input section of the computer system.

A permanent magnet 76 having N and S poles is arranged above the upper electrode 40. It is supported rotatable by a drive means (not shown) which is provided with a vertical shaft. Magnetic field of 10–1000 G oersted is thus formed on the surface of the wafer W in the process chamber 16. An O-ring 78 is interposed in a joint between the side wall of the process chamber 16 and the upper electrode 40 to seal the inside of the process chamber 16 air-tight. Although an etching method of the present invention will be described while using the magnetron plasma etching apparatus of the hyperbolic type, the magnetron etching apparatus of the bipolar type may be used instead.

Figure 4:
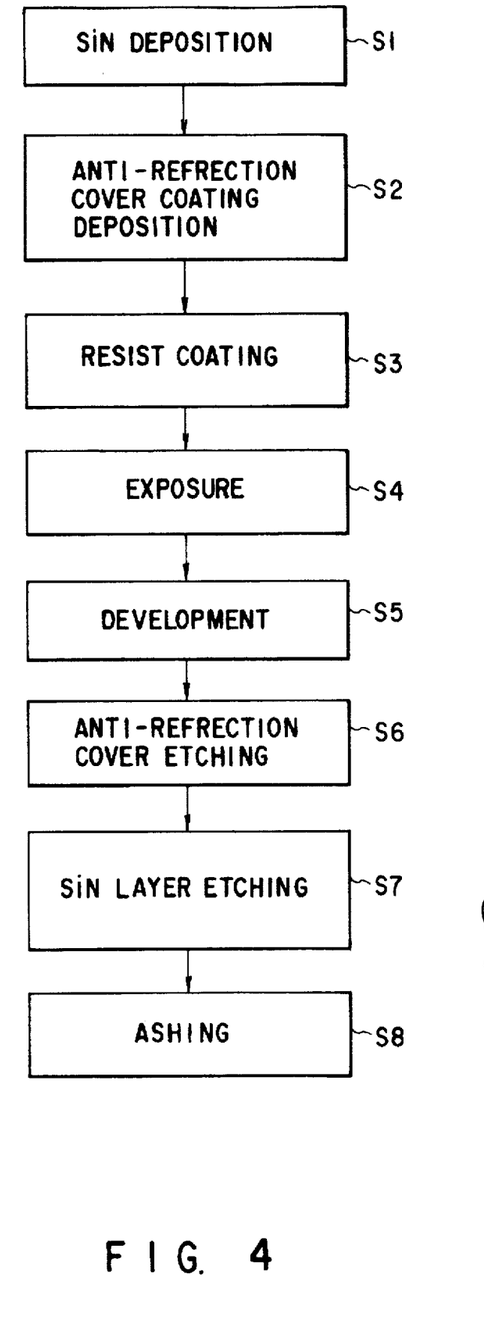
FIG. 4 is a flow chart showing the first etching method of the present invention.
Figure 5:
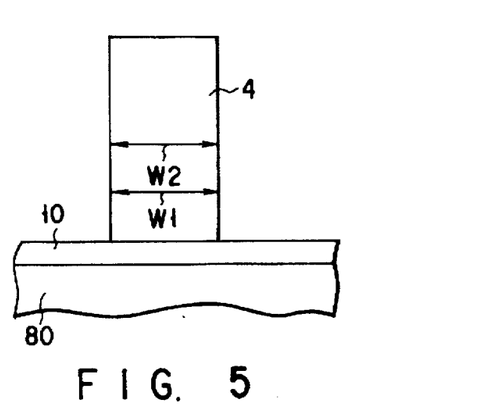
FIG. 5 is a partly-enlarged sectional view showing an object to be etched on a semiconductor wafer.
Figure 6:
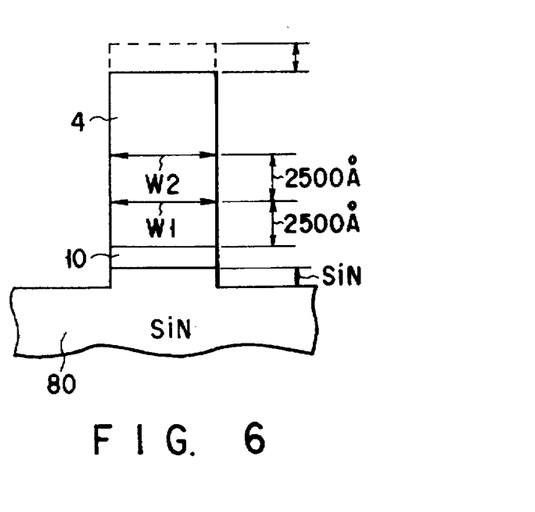
FIG. 6 is a partly-enlarged sectional view showing another object to be etched on the semiconductor wafer.

Referring to FIGS. 4 through 6, a method of etching thin film on a wafer will be described using the above-described etching apparatus.

SiN film 80 is formed on a silicon wafer W by the CVD or sputtering apparatus (step S1). This SiN film 80 is an object to be pattern-etched. The surface of SiN film 80 formed by CVD has a roughness of 0.002–0.018 μm (2–18 nm) when expressed in the center line average roughness Ra and a roughness of 0.03–0.06 μm (30–60 nm) when expressed in the maximum height Rmax. SiN film 80 is about 600 nm thick.

The wafer W is then mounted on a spin chuck of a coating apparatus and an appropriate amount of ARC component solution is dropped on the surface of the wafer W while spin-rotating it. Solution thus dropped spreads on the wafer and the anti-reflection cover 10 having a substantially flat surface is thus formed on the wafer W (step S2). The anti-reflection cover 10 thus formed dries for a while and it keeps its surface substantially flat even after it becomes dried. SiN film 80 is coated by this flat anti-reflection cover 10. The anti-reflection cover 10 has a thickness of 40–100 nm after it becomes dried.

Further, an appropriate amount of photoresist solution is dropped on the wafer W while spin-rotating it. Photoresist solution thus dropped spreads on the wafer W and photoresist film 4 having a substantially uniform thickness is thus formed on the wafer W (step S3). Further, the photoresist film 4 is dried and baked.

The wafer is then carried into an exposing unit where the photoresist film 4 on the wafer W is exposed to a desired pattern (step S4). Exposing light (or ultraviolet ray) 6 is passed through the photoresist film 4 and reflected by the top of the anti-reflection cover 10. The top of the anti-reflection cover 10 has an ideal flatness in this case. Therefore, the reflected light returns to its light source, passing through its incident passage but without being irregularly reflected. After it is exposed, the wafer W is mounted on a spin chuck and an appropriate amount of developer is dropped on the wafer W while spin-rotating it, thereby developing the pattern-exposed photoresist film 4 (step S5). The photoresist film 4 is thus partly removed to thereby form a resist pattern which has pattern openings. The anti-reflection cover 10 is exposed in each of the pattern openings. The wafer W is rinse-cleaned and dried after it is developed.

The wafer W is then carried into the etching apparatus 14 through a load lock chamber (not shown) and mounted on the electrostatic chuck 36 to be electrostatically attracted and held on it. Gases are introduced from three gas supply sources 68, 70 and 72 into the chamber 16 while exhausting the chamber 16. Gas flow rates of gases supplied from the gas supply sources 68, 70 and 72 are controlled by mass flow controllers 56, 58 and 60. $O_2$ gas is added to $C_4F_8$ gas this time at a flow rate about 4 times the flow rate of $C_4F_8$ gas. Ar gas follows, as carrier gas. $C_4F_8/O_2$ gas (or etching gas)

at a predetermined flow rate. The process chamber 16 is controlled to an internal pressure of 40 mTorr, for example, while exhausting it and gas-introducing into it at the same time.

Radio frequency voltage is applied between the upper and lower electrodes 40 and 24 to generate plasma in the chamber 16. Gases are thus turned into plasma and the etching gas is gradually dissociated by this energy to thereby generate various active species. When these active species reach the wafer W, they act on the anti-reflection cover 10, which is exposed in each of the pattern openings, to thereby etch it alone (step S6). Mixed gas in which $C_4F_8$ and $O_2$ gases are mixed at an optimum rate is used as the etching gas in this case. The etching of the photoresist film 4 in a direction (or horizontal direction) perpendicular to its film thickness can be thus suppressed, while etching the anti-reflection cover 10 alone in its film thickness direction, thereby enabling a mask to be formed with a higher accuracy.

The SiN layer 80 which is exposed in each of the pattern openings may be removed while continuing the same etching process (step S7). An etching process for removing the SiN layer 80 may be provided (step S7), independently of the etching process for the anti-reflection cover 10 (step S6). After the SiN layer 80 is pattern-etched, all of the photoresist film 4 is removed from the wafer W in an ashing unit (step S8).

According to the above-described example, the etching of the photoresist film 4 in the direction (or horizontal direction) perpendicular to its film thickness can be substantially prevented to thereby enable the mask to have a higher dimension accuracy.

It is preferable in this case that the amount of $O_2$ or $N_2$ gas added is set to be in a range three to five times the amount of $C_4F_8$ gas, most preferably, in a range about four times. When the amount of $C_4F_8$ gas is smaller than values in this optimum range, the etching rate becomes excessive. When it is larger than values in this range, etching products adhere to the enclosing side wall of each of the pattern openings to thereby make each pattern opening smaller.

Referring to FIGS. 5 through 8, it will be confirmed from results obtained from actually-conducted etchings whether or not the above-mentioned mixing rate of etching gas is right.

As shown in FIG. 5, the anti-reflection cover 10 was formed on the SiN under-layer and etched using the photoresist film 4 as the mask. Mixed gas of $C_4F_8$ and $O_2$ was used as the etching gas and etching was confirmed while changing the mixing rate of these gases.

FIG. 6 is a sectional view showing the photoresist film 4, the anti-reflection cover 10 and the underlayer 80 after etching. A width $W_1$ of the film 4 was measured at a position separated from the top of the anti-reflection cover 10 in the film thickness direction by 250 nm and another width $W_2$ at a position separated by 500 nm. From widths $W_1$ and $W_2$ thus measured, amounts of the photoresist film 4 removed by etching and added by deposition were obtained. Two kinds of the photoresist film 4 having initial widths of 0.25 μm and 0.375 μm were checked to confirm them etched.

Process pressure was 40 mTorr, radio frequency power output was 1400 W, the temperature of the chamber inner wall was 60° C. and the temperature of the suscepter 24 was 20° C. The amount of $O_2$ gas was fixed to be 20 SCCM and the amount of $C_4F_8$ gas was variously changed in a range of 3–7 SCCM. Results thus obtained will be described referring to FIGS. 7 and 8.

Figure 7:
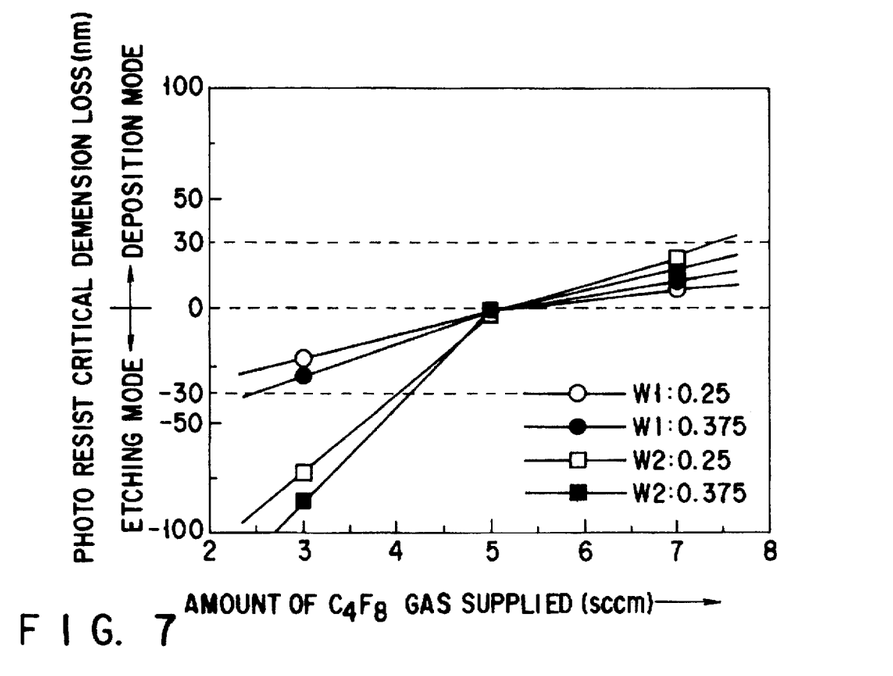
FIG. 7 is a graph showing how the amount of photoresist film changes as $C_4F_8$ is added.
Figure 8:
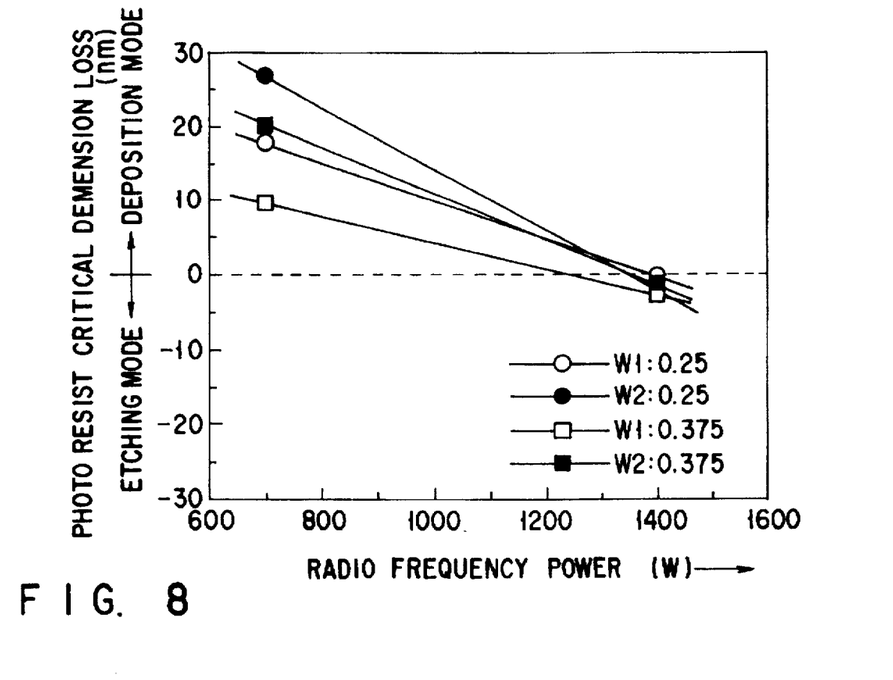
FIG. 8 is a graph showing how the amount of photoresist film changes as radio frequency power becomes higher.

FIG. 7 is a characteristic line graph showing how the film thickness (nm) of the photoresist film is changed relative to the amount (SCCM) of $C_4F_8$ gas supplied, in which the amount of $C_4F_8$ gas supplied is plotted on the horizontal axis and the film thickness of the photoresist film on the vertical axis. FIG. 8 is a characteristic line graph showing how the film thickness (nm) of the photoresist film is changed relative to radio frequency power (W) supplied, in which the film thickness is plotted on the vertical axis and radio frequency power on the horizontal axis. Values displayed on the vertical axis by minus represent amounts of the photoresist film 4 removed by etching and those by plus denote amounts of reaction products stuck to the photoresist film 4 at the time of etching. White circles represent results obtained when the photoresist film 4 has the width $W_1$ of 0.25 μm, and black ones denote those obtained when it has the width $W_1$ of 0.375 μm. White rectangles represent results obtained when it has the width $W_2$ of 0.25 μm and black ones denote those obtained when it has the width $W_2$ of 0.375 μm.

As apparent from FIG. 7, it has been found that the etching amount becomes gradually larger as the amount of $C_4F_8$ gas added is gradually increased from 3 SCCM to 7 SCCM and that the width W of the photoresist film 4 becomes larger because reaction products adhere to the film 4 from the half way of the process.

When the amount of $C_4F_8$ gas added is 3 SCCM, that portion of the photoresist film 4 which corresponds to the width $W_2$ (or 500 nm) is removed to the greatest extent by etching. This is not preferable. When it is 5 SCCM, those portions of the film 4 which correspond to the widths $W_1$ and $W_2$ is hardly removed by etching. The amount of those portions removed is substantially zero in this case. This is the most preferable. When it is 7 SCCM, the side wall of the film 4 is not etched but becomes a little thicker because reaction products by etching adhere to it.

According to the micro-processing technique now available, the diameter of each pattern opening is allowed to have an error tolerance of about +30 nm. As apparent from FIG. 7, therefore, the amount of $C_4F_8$ gas added to $O_2$ gas of 20 SCCM is set to be in the range of 4–7 SCCM. When the amount of $O_2$ gas supplied is set to be 3–5 times the amount of $C_4F_8$ gas added in this manner, it has been confirmed that the change in the width W of the photoresist film 4 can be suppressed to the best.

When the mixing rate of $C_4F_8$ and $O_2$ gases is set to be in the above-mentioned range, it is the anti-reflection cover 10 that is actually etched, and the mask thus formed can be kept higher in accuracy. The photoresist film 4 is also etched in its film thickness direction, as shown in FIG. 6, when the anti-reflection cover 10 is etched, but this adds no influence to the mask accuracy.

FIG. 8 shows how the amount of the photoresist film changes as radio frequency power added is changed, while keeping the mixing rate of $C_4F_8$ and $O_2$ gases at 1:4. When radio frequency power is in a range of 700 W–1400 W, for example, it has been confirmed that the amount of the photoresist film is hardly changed and that the gas mixing rate is in the above-mentioned range.

When the mixing rate of $C_4F_8$ and $O_2$ gases is set to be in an appropriate range, as described above, the anti-reflection cover 10 can be etched while suppressing amounts of the photoresist film 4 removed by etching and added by deposition in the direction (or horizontal direction) perpendicular to the thickness of the film 4. A mask, higher in accuracy, can be thus formed.

A second embodiment of the present invention will be described referring to FIGS. 10 through 14. Same components as those of the first embodiment will be mentioned only when needed.

Figure 10:
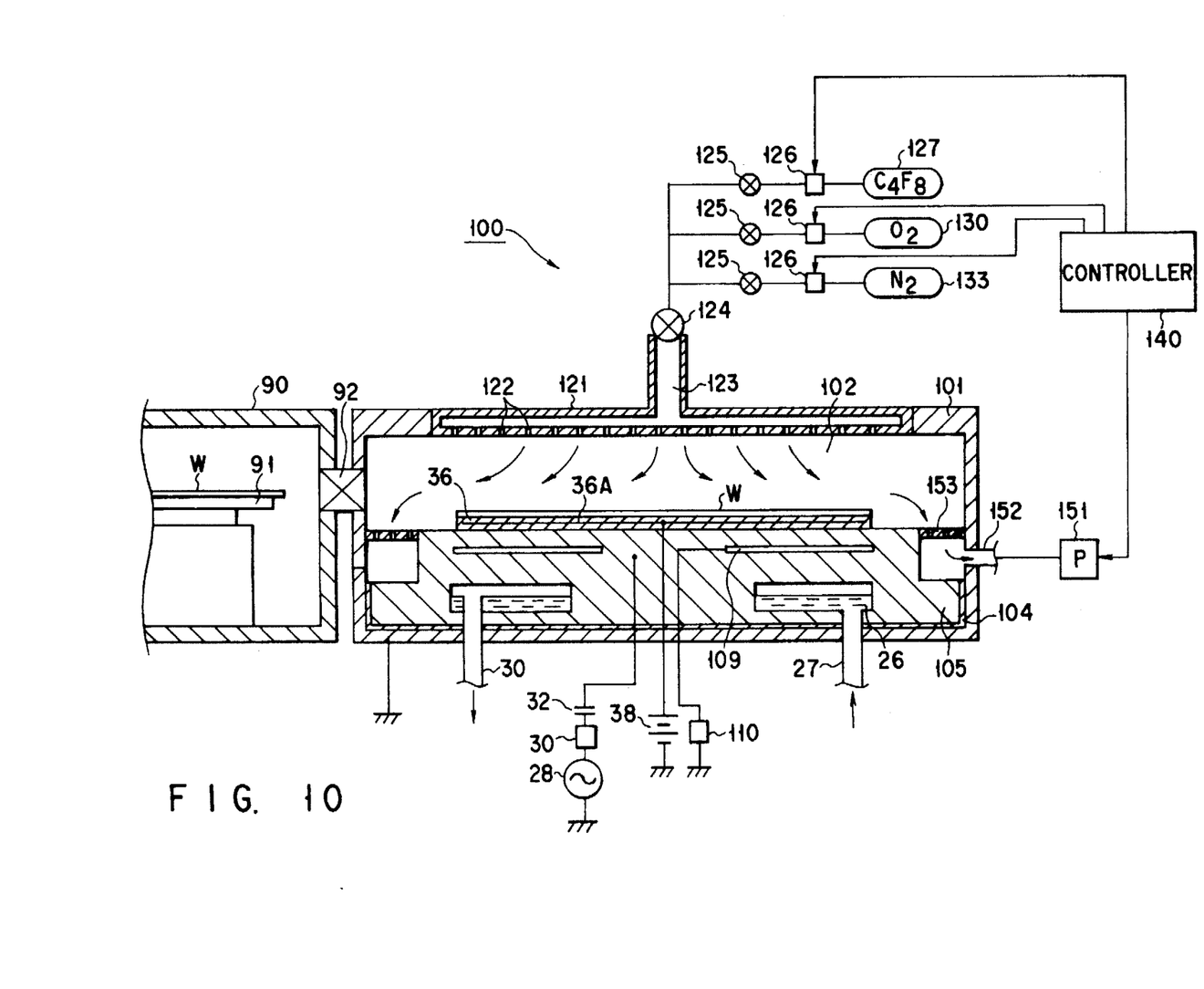
FIG. 10 is a sectional block diagram showing a plasma etching apparatus employed by the etching method according to a second embodiment of the present invention.

A chamber 101 of an etching apparatus 100 is earthed. A susceptor 105 provided with the electrostatic chuck 36 is arranged in the chamber 101. It is connected to the radio frequency power source 28 and insulated from the chamber 101 by an insulating member 104. It has the ring-shaped cooling chamber 26 in it. Temperature adjusting coolant is introduced into the cooling chamber 26 through the pipe 27 and exhausted from it through the pipe 30 after it is circulated in the cooling chamber 26. A ceramic heater 109 connected to a power source 110 is arranged in the susceptor 105, which is temperature-controlled in a range of −50° C.–+60° C. This temperature adjustment of the susceptor 105 is conducted by a temperature sensor (not shown) and a controller 140.

An upper electrode 121 is arranged above the susceptor 105. It is made hollow and it has a plurality of apertures 122 in its bottom. A gas inlet 123 is communicated with its hollow portion and also with three gas supply sources 127, 130 and 133 through a main valve 124. $C_4F_8$ gas is stored in the first gas supply source 127, $O_2$ gas in the second gas supply source 130, and $N_2$ gas in the third gas supply source 133. A valve 125 and a mass flow controller 126 are arranged between the main valve 124 and each of the gas supply sources 127, 130 and 133. Each mass flow controller 126 is connected to an output section of the controller 140, which is also connected to a power source for a vacuum pump 151.

A suction side of the vacuum pump 151 is communicated with an exhaust pipe 152, which is opened in the chamber 101 below an exhaust ring 153. The exhaust ring 153 is arranged between the top circumference of the susceptor 105 and the inner wall of the chamber 101 and it has plural holes 153a. The internal pressure of the chamber 101 can be thus controlled to be in a range of 5 mTorr–100 mTorr.

The radio frequency power source 28 is connected to the susceptor 105 via the matching unit 30 and the blocking capacitor 32 to apply radio frequency current having a frequency of 13.56 MHz and an output of 1000–2000 W to it.

A load lock chamber 90 is arranged adjacent to the process chamber 101 and they are communicated with each other through a gate valve 92. A carrier arm 91 is arranged in the load lock chamber 90.

Another etching method suitable for the above-described etching apparatus 100 will be described referring to FIGS. 11 through 14.

Figures 11, 12A, 12B:
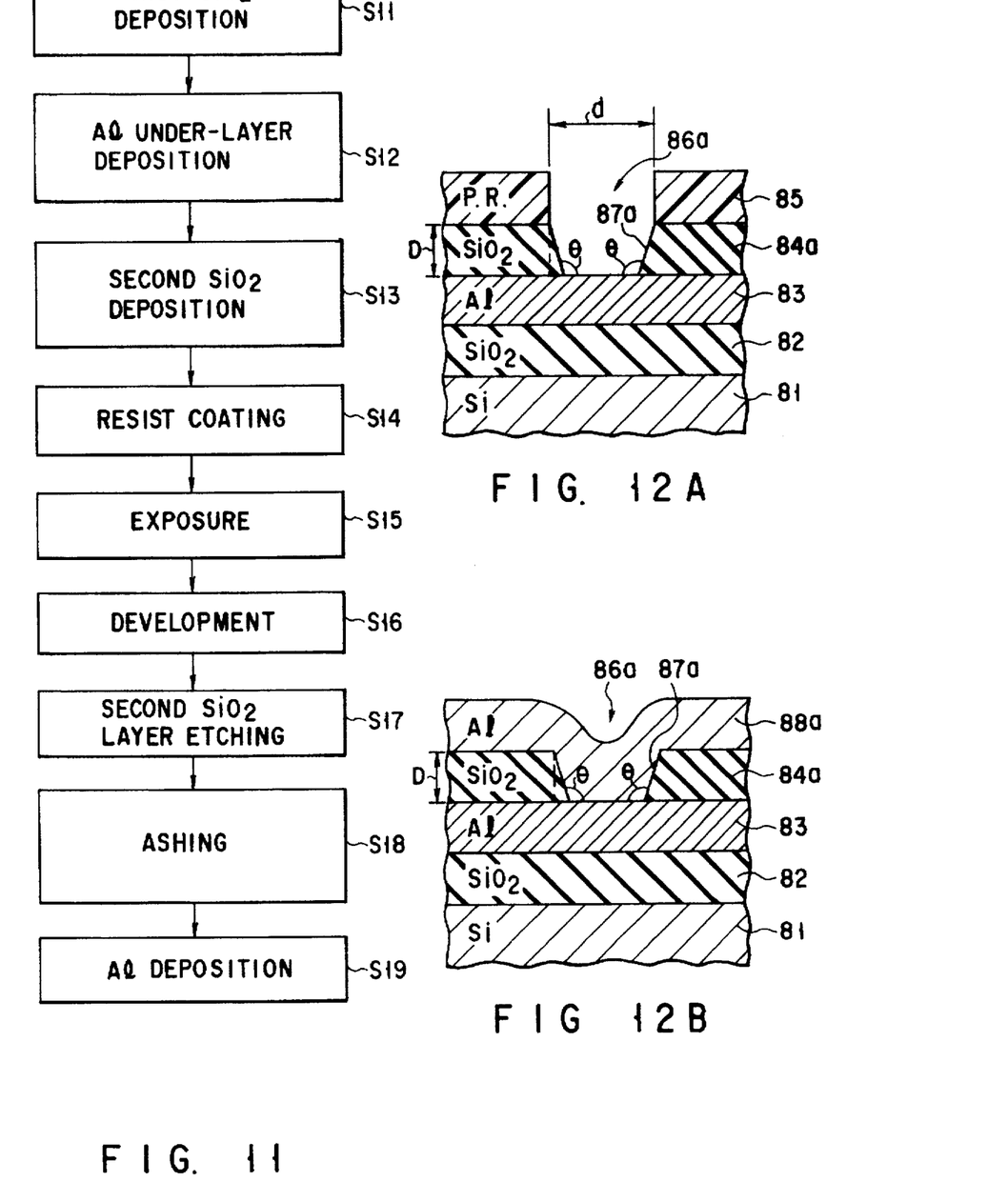
FIG. 11 is a flow chart showing the second etching method of the present invention.
FIG. 12A is a sectional view showing a wafer etched.
FIG. 12B is a sectional view showing the wafer in which the wiring has been made.

A silicon wafer W is carried into an oxidizing apparatus and a first silicon oxide film ($SiO_2$) 82 is formed there on a wafer substrate 81 (step S11). The wafer W is carried into a CVD apparatus and an aluminum layer 83 is formed there on the first silicon film 82 (step S12). This aluminum layer 83 serves as an under-layer for a second silicon oxide film 84a next formed thereon. The second silicon oxide film 84a is formed on the Al under-layer 83 in the CVD apparatus (step S13).

The wafer W is mounted on a chuck of a spin coater to coat a photoresist 85 on the second silicon oxide film 84a (step S14).

The wafer W is carried into an exposing unit to expose the photoresist film 85 in a desired pattern (step S15). After this exposure, the wafer W is mounted on a spin chuck and an appropriate amount of developer is dropped on the wafer W, while spin-rotating it, to thereby develop the pattern-exposed photoresist film 85 (step S16). The photoresist film 85 is thus partly removed to form a resist pattern having pattern openings 86a. Each pattern opening 86a has a diameter d of about 0.2 µm and the second silicon oxide film 84a is exposed in it. After the developing step, the wafer W is rinsed and dried.

The wafer W is then carried into the etching apparatus 100 through the load lock chamber and electrostatically attracted and held on the electrostatic chuck 36. Gases are introduced from the three gas supply sources 127, 130 and 233 into the chamber 101 while exhausting it. The gas flow rate of each of gases supplied from the gas supply sources 127, 130 and 133 is controlled by the mass flow controller 126. The internal pressure of the chamber 101 is controlled to be about 40 mTorr by the controller 140.

Radio frequency current having a frequency of 13.56 MHz and a power of 1400 W is applied from the power source 28 to the susceptor 105 to generate plasma between the electrodes 105 and 121. $C_4F_8$ gas in the chamber 101 is dissociated by plasma to thereby generate $CF_2^+$ ions. These ions make it difficult to create free fluorine radicals by which the under-layer is etched. Therefore, the metal under-layer 83 is not etched but only the insulating layer 84 is etched by $CF_2^+$ ions. An etching having a higher selection rate can be thus attained.

As shown in FIG. 12A, the second silicon oxide film 84a which is exposed in the pattern opening 86a is etched by $CF_2^+$ ions and the metal under-layer 83 is thus exposed in the hole 86a (step S17). A product of the fluorocarbon group such as $SF_2$ is deposited on the bottom of the pattern opening 86a by the etching at the step S17 to thereby greatly tilt the side wall 87a of the pattern opening 86a. In short, the tapered angle θ of the pattern opening 86a becomes obtuse. It is preferable in this example that the tapered angle θ is made to be in a range of 100°–110° by adjusting the composition of etching gas and controlling the susceptor temperature. When the pattern opening 86a has a diameter d of 0.8 µm and the $SiO_2$ layer 84a has a thickness D of 600 nm, for example, it is preferable that the $SiO_2$ layer 84a is etched to make the tapered angle θ 105°.

The photoresist film 85 is removed by ashing to expose the second silicon oxide film 84a (step S18). The wafer W is carried into the vaporing, sputtering, ion-plating or CVD apparatus to form an Al wiring layer 88a which is connected to the metal under-layer 83 through the pattern opening 86a (step S19), as shown in FIG. 12B. Aluminum which forms the wiring layer 88a is fully filled even at the bottom corner of the pattern opening 86a because the tapered angle θ of the pattern opening 86a is obtuse. As the result, a wiring having no fault but a higher reliability can be provided in a super-micro circuit which has a line width of submicron order.

Figure 13:
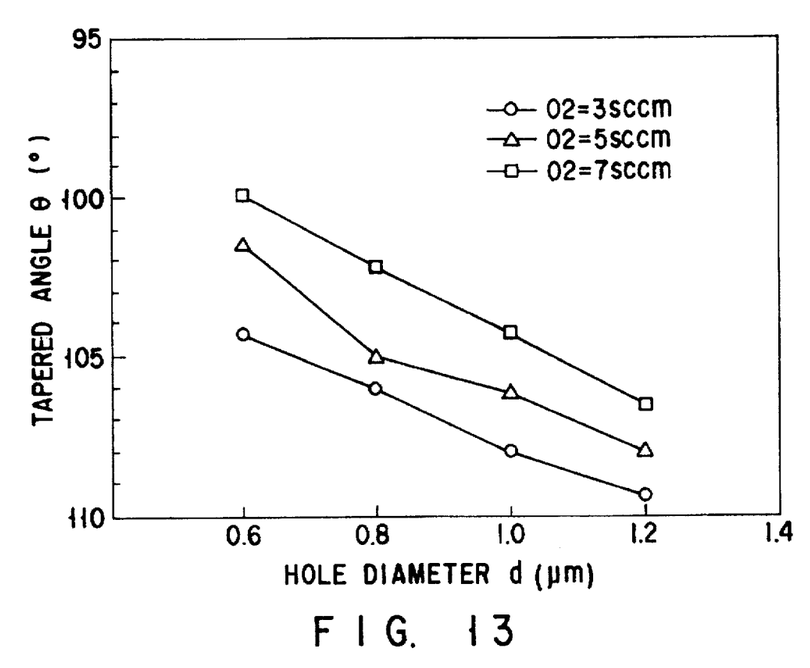
FIG. 13 is a graph showing how the diameter of a contact hole is related to the tapered angle of its enclosing side wall when the component flow rate of etching gas is used as a parameter.
Figure 14:
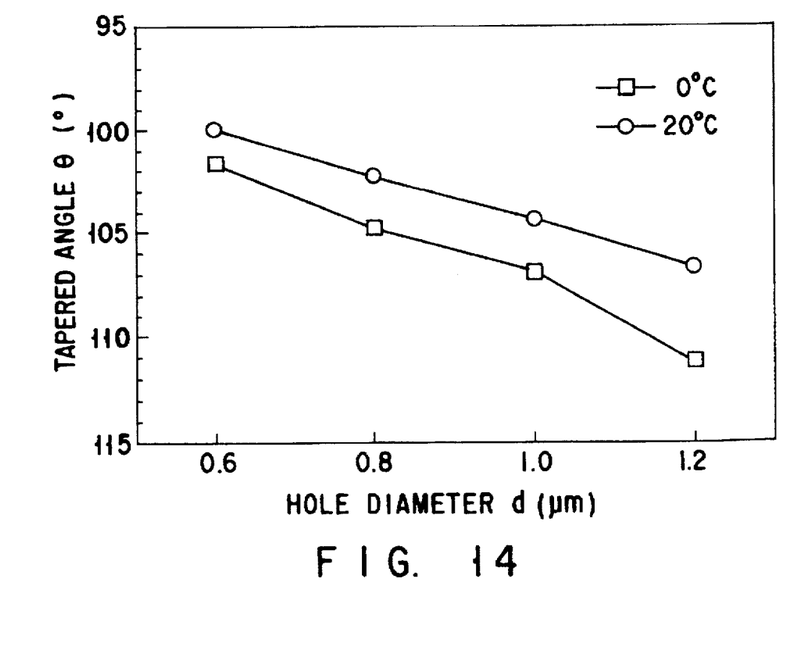
FIG. 14 is a graph showing how the diameter of the contact hole is related to the tapered angle of its enclosing side wall when temperature at etching process is used as a parameter.

Data obtained from the etching process actually conducted by inventors will be described referring to FIGS. 13 and 14.

The wafer W which was to be etched was same as the above-described one and the thickness D of the $SiO_2$ layer 84a was 600 nm. The etching rate of the $SiO_2$ layer 84a was about 500 nm/minute. The internal pressure of the process chamber 101 was 40 mTorr, the power of the radio frequency power source 28 was 1400 W, the temperature of the inner wall at the top and side of the process chamber was 60° C. and the temperature of the susceptor 105 was 20° C.

While changing the flow rate of $O_2$ gas relative to $C_4F_8$ gas from 3 SCCM to 5 SCCM and 7 SCCM but keeping the flow rate of $C_4F_8$ gas certain or at 25 SCCM, it was checked how the tapered angle θ changed relative to the diameter d of the pattern opening. Results thus obtained are shown in FIG. 13. As apparent from FIG. 13, it was found that the tapered angle θ became smaller, no matter how the hole diameter d might be large or small, as the flow rate of $O_2$ gas relative to $C_4F_8$ gas was increased. When the amount of $O_2$ gas added to $C_4F_8$ gas is controlled, therefore, the tapered angle θ can be optionally changed.

The gas flow rate was kept certain or the flow rate of $O_2$ gas relative to the flow rate 25 SCCM of $C_4F_8$ gas was fixed at 7 SCCM and the temperature of the suscepter 105 was set to be 0° C. and 20° C. It was checked under these conditions how the tapered angle θ changed relative to the hole diameter d of the pattern opening. Results thus obtained are shown in FIG. 14. As apparent from FIG. 14, it was found that the tapered angle θ became larger, no matter how the hole diameter d might be large or small, as the temperature of the suscepter 105 became lower. When the temperature of the suscepter 105 is controlled and that of the wafer W is changed, therefore, the tapered angle θ can be optionally adjusted.

Although $O_2$ gas has been added to $C_4F_8$ gas in the above-described embodiments, $N_2$ gas, its mixed gas or other inactive gases may be used instead of $O_2$ gas.

According to the present invention, a higher selection rate of selectively etching only the insulating layer but the metal under-layer can be attained and a pattern opening having such a shape that allows metal to be filled more enough can be provided.

Further, the etching rate of the insulating film can be made higher to thereby increase the throughput. In addition, the internal pressure of the process chamber can be set to be in a larger range.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. An etching method comprising the steps of:

a) forming an under-layer to be etched on a substrate;

b) covering said under-layer with an anti-reflection coating by applying a solution containing a carbon component on the substrate while the substrate is being rotated;

c) covering the anti-reflection coating with a photoresist film by applying a photoresist solution on the substrate while the substrate is being rotated;

d) pattern-exposing the photoresist film to form an exposed photoresist film;

e) developing the exposed photoresist film to form pattern-openings in each of which said anti-reflection coating is exposed;

f) placing the substrate into a chamber having a pair of parallel electrodes, and exhausting the chamber;

g) introducing a mixed gas of $C_4F_8$ gas and at least one of $O_2$ and $N_2$ gases into the chamber; and h) applying a high frequency voltage to said parallel electrodes so as to generate plasma of the mixed gas between said parallel electrodes, an active species of said plasma flowing down so that a down flow portion of said plasma acts on the substrate to perform an etching step on the substrate;

whereby in said etching step the anti-reflection coating which is exposed in each of the pattern-openings is etched and said under-layer is also etched without etching that portion of the photoresist film which defines each of the pattern-openings.

2. The etching method according to claim 1, wherein the amount of said at least one of $O_2$ and $N_2$ gases added is in a range of three to five times the amount of $C_4F_8$ gas.

3. The etching method according to claim 1, wherein the mixed gas comprises only $O_2$ gas added to $C_4F_8$ introduced into the process chamber.

4. The etching method according to claim 1, wherein the etched layer is selected from the group consisting of a silicon oxide, silicon nitride, single crystal silicon and polycrystalline silicon film.

5. The etching method according to claim 1, wherein the anti-reflection coating is a film comprising mainly carbon and having a flat surface.

6. The etching method according to claim 1, wherein the film thickness of the anti-reflection coating is in a range of 40–100 nm.

7. The etching method according to claim 1, wherein the width of each of said pattern-openings is smaller than 1 μm.

* * * * *